United States Patent [19]
Green

[11] 4,129,799
[45] Dec. 12, 1978

[54] PHASE REVERSAL ULTRASONIC ZONE PLATE TRANSDUCER

[75] Inventor: Philip S. Green, Atherton, Calif.
[73] Assignee: SRI International, Menlo Park, Calif.

[21] Appl. No.: 644,093
[22] Filed: Dec. 24, 1975
[51] Int. Cl.$^2$ ........ H01L 41/10
[52] U.S. Cl. ........ 310/359; 310/366
[58] Field of Search ........ 310/8.2, 8.5, 9.5, 9.6, 310/9.7, 9.8, 359, 366, 369

[56] References Cited

U.S. PATENT DOCUMENTS

| | | | |
|---|---|---|---|
| 2,194,539 | 3/1940 | Barry et al. | 310/9.8 |
| 2,875,355 | 2/1959 | Peterman | 310/9.8 X |
| 3,384,767 | 5/1968 | Arnold et al. | 310/9.8 X |

*Primary Examiner*—Mark O. Budd
*Attorney, Agent, or Firm*—Victor R. Beckman

[57] ABSTRACT

Focused ultrasonic transducer means of the zone plate type are shown for producing a focused ultrasonic wave field without the need for lenses, reflectors, a curved transducer or the like, which transducer means are adapted for ultrasonic nondestructive testing and inspection, ultrasonic examination in diagnostic medicine, sonic heat generation, aerosol formation, and the like. Such transducer means, of course, may be used as a focused ultrasonic transducer receiver as well as a transmitting transducer. The transducer includes a uniformly poled cylindrical shaped body of electromechanically responsive material, such as a piezoelectric crystal, with electrodes formed at opposite parallel faces thereof. A pair of central axially aligned circular electrodes of different size are located on the opposite body faces, together with concentric different size annular electrodes which surround the central electrodes. The radii of the central and annular electrodes are of different lengths such that electrodes on one face overlap adjacent electrodes on the opposite face, with the radial width of the overlapping areas decreasing inversely with increased radial position such that substantially equal overlapping electrode areas are formed. Electrical connection is made between the smallest diameter inner electrode and largest diameter outer electrode such that the large inner circular electrode and annular electrodes function, electrically, as pairs of series-connected electrodes, each of opposite phase. This electrode arrangement, on a uniformly polarized transducer body, results in a transducer with adjacent active opposite polarity zones having opposite deformation, the number of zones being equal to one less than the total number of electrodes employed.

10 Claims, 2 Drawing Figures

PHASE REVERSAL ULTRASONIC ZONE PLATE TRANSDUCER

BACKGROUND OF INVENTION

Ultrasonic focused transducer means of the zone plate type are well known, the operation of which are dependent upon the diffraction phenomenon of acoustic waves and, in particular, upon Fresnel diffraction. One type of acoustic plane transducer includes active areas, or zones, which correspond to the transmissive zones of a Fresnel zone plate, or lens. Such devices may be arranged for energization of the central section or zone, corresponding to a transmissive central zone of a Fresnel zone plate. Alternatively, the central section may be unenergized to correspond to the non-transmissive central zone of a Fresnel zone plate. In a further arrangement, of the type to which the present invention is directed, adjacent zones of the transducer are energized in 180° out of phase relationship whereby both the "in-phase", and "out of phase" regions, or zones, are active for increased power sensitivity or output, and for better approximation to a perfect focus. Prior art transducers of this general type are shown, for example, in U.S. Pat. No. 2,875,355 issued Feb. 4, 1959, and in an article by S. A. Farnow and B. A. Auld, entitled "An Acoustic Phase Plate Imaging Device" presented at The Sixth International Symposium on Acoustical Holography and Imaging, Feb. 4–7, 1975 at San Diego, CA.

Various arrangements for providing for adjacent active zones within the transducer body are known. In one such arrangement the transducer body is uniformly poled and the individual zones are shunt-connected in proper phase relationship to obtain adjacent active zones. In another arrangement, the adjacent zones are oppositely polarized and single electrodes are provided at opposite faces thereof. With such prior art arrangements shunt connection is made to the zones thereby resulting in a low impedance transducer difficult to match to the impedance of an rf drive source, or a receiver.

SUMMARY OF INVENTION

An object of this invention is the provision of a focused ultrasonic zone plate transducer which is easily constructed, efficient in operation, and capable of producing a sharp focus without the use of lenses, reflectors, curved transducers, or the like.

An object of this invention is the provision of an improved ultrasonic zone plate transducer with adjacent active opposite polarity zones, which transducer has a high impedance to facilitate coupling to a source or signal processing receiver of ultrasonic rf energy.

The above and other objects and advantages of the invention are achieved by means of a transducer formed by use of a uniformly polarized piezoelectric body of cylindrical shape on the opposite faces of which electrodes are formed. In particular, different size central circular electrodes are formed on the opposite faces, surrounded by concentric annular electrodes, with electrodes on one face being positioned in an overlapping position with respect to electrodes on the opposite face. The areas of overlap decrease in radial width with distance from the center in a manner such that the areas of overlap are of substantially equal area. Electrical connection is made between the small central electrode and outermost annular electrode for connection to a drive or receiving circuit depending upon whether operation in a transmitting or receiving mode is desired. With this novel arrangement the large central electrode and surrounding annular electrodes function as pairs of series connected electrodes of opposite phase to provide a transducer body having adjacent active zones equal in number to one less than the total number of electrodes included therein. With such series connection of electrodes a high impedance transducer is provided having improved driving and receiving characteristics.

BRIEF DESCRIPTION OF DRAWINGS

The invention will be better understood from the following description taken in connection with the accompanying drawings. In the drawings, wherein like reference characters refer to the same parts in the several views.

Figure 1:
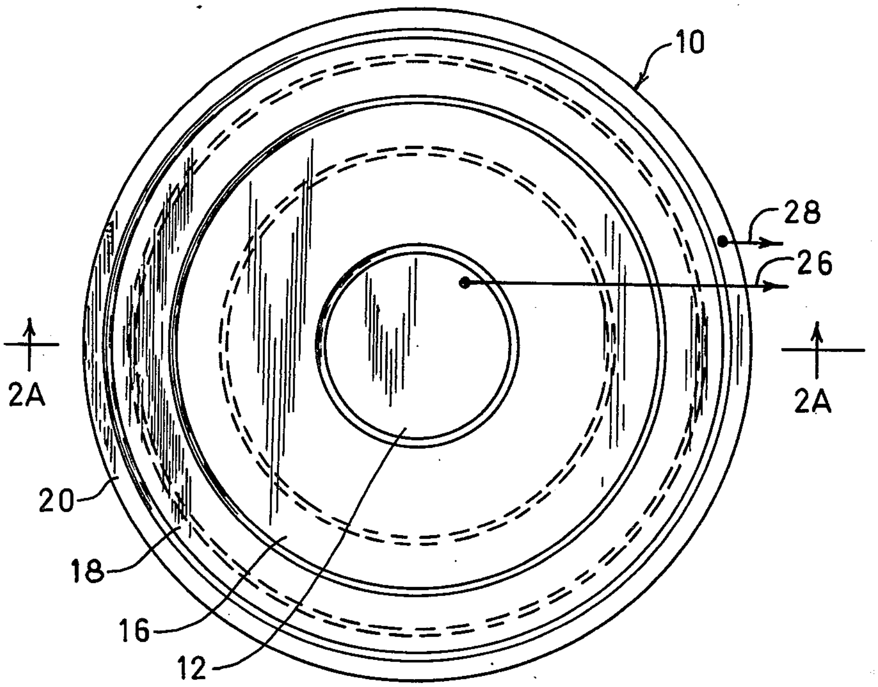
FIG. 1 is a plan view of an ultrasonic zone plate transducer embodying this invention.

Referring to the drawings, the transducer of this invention is shown comprising a cylindrical shaped body 10 of piezoelectrical material of any well known type. For example, a titanate material such as barium titanate may be used which is uniformly polarized normal to the opposite parallel faces during manufacture as by exposure to a unidirectional electric field thereacross.

A plurality of electrodes, including axially aligned central circular electrodes 12 and 14, are disposed on opposite faces of the transducer body. It will be noted that electrode 14 is of a larger diameter than electrode 12 to overlap the same. In addition to the different diameter central electrodes, a plurality of concentrically disposed annular electrodes are provided which surround the central electrodes. For purposes of illustration three concentrically disposed annular electrodes 16, 18 and 20 are shown surrounding the small diameter central electrode 12, and two concentrically disposed annular electrodes 22 and 24 are shown surrounding the large diameter central electrode 14 at the opposite face.

Unlike prior art arrangements wherein the zone plate electrodes on one surface of the transducer either directly overlie zone electrodes of the same dimensions on the other face, or overlie a large counter-electrode covering the entire other face, with the present transducer, electrodes on one surface overlap adjacent electrodes on the opposite face. As will become apparent hereinbelow adjacent active zones are determined by such overlapping areas. It here will be noted that the theory and formulae for determining the dimensions of the various zones of a zone plate focusing transducer are well known and will not be repeated here. In general, the zones are of substantially equal area, with the size thereof depending upon the desired focal length of the focusing transducer and the wavelength of the acoustic waves to be focused. Also, the number of zones employed is not critical and may vary widely. In practice, five to seven zones often are employed.

Figure 2:
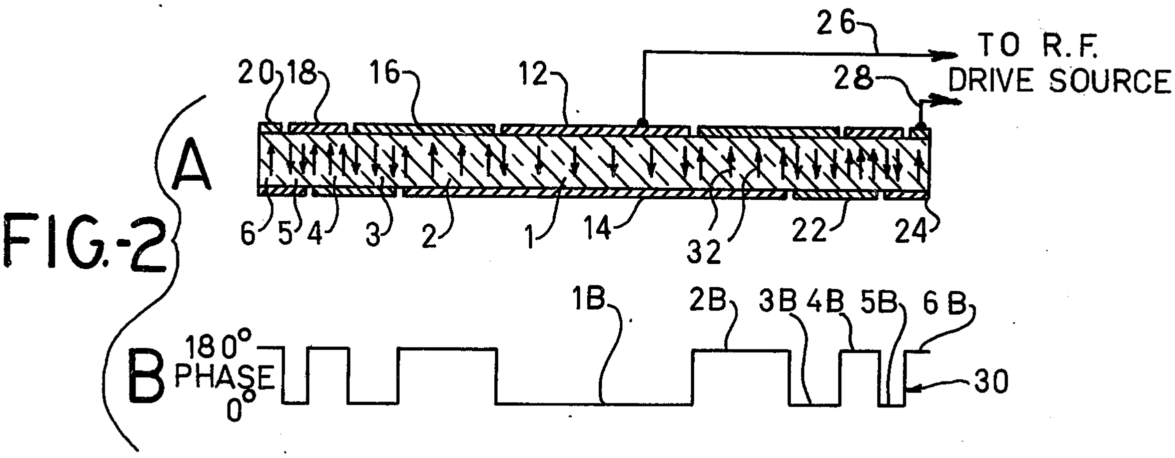
FIGS. 2A and 2B show a cross sectional view of the transducer taken along lines 2A—2A of FIG. 1 and a curve showing the phase relationship of the effective zones across a face of the transducer, respectively.

As seen in the drawings, electrical connection to the transducer is made by connection to the small diameter central electrode 12 and an outer annular electrode 20 through lead wires 26 and 28, respectively. For use as a transmitting transducer, the lead wires are connected to a source of rf energy, not shown, of a frequency corresponding to the operating frequency of the transducer. With the novel electrode arrangement, adjacent zones are active for generation of acoustic energy over the entire face of the transducer upon application of a suitable drive voltage thereto. That is, adjacent zones have opposite deformations such that one contracts while the other expands when an rf signal is applied to the leads 26 and 28 for the generation of 180° out of phase signals in adjacent zones. A curve 30 of the instantaneous phase of the acoustic energy field generated upon application of an rf source to the transducer is shown in FIG. 2B. The polarity of the instantaneous electric field within the transducer body provided by the driving voltage is shown by arrows 32, and the zones are identified by reference characters 1, 2, 3, 4, 5 and 6 in FIG. 2A. As the curve 30 and arrows 32 indicate, the phase is reversed in adjacent regions, or zones. In FIG. 2B portions of the curve 30 which result from the adjacent opposite polarity zones are identified by reference characters 1B, 2B, 3B, 4B, 5B and 6B in correspondence with the zones 1, 2, 3, 4, 5 and 6, respectively. It will be seen that the large diameter central electrode 14 and the annular electrodes 16, 18, 22, and 24 each overlap electrodes at the opposite face, and that such overlapping electrodes operate, essentially, as pairs of series connected electrodes at adjacent transducer zones. That is, central electrode 14 in association with electrodes 12 and 16 provide for transducer zones 1 and 2, annular electrode 22 in association with electrodes 16 and 18 provide for transducer zones 3 and 4, and annular electrode 24 in association with electrodes 18 and 20 provide for transducer zones 5 and 6. With such a series connected electrode arrangement the transducer has a substantially higher electrical impedance than piezoelectric transducers of the prior art type having complete electrodization on one or both sides of the transducer body.

The invention having been described in detail in accordance with the requirements of the Patent Statutes, various changes and modifications will suggest themselves to those skilled in this art. For example, where an even number of active zones are employed, as illustrated, both electrical connections 26 and 28 are made to electrodes on the same face of the piezoelectric body. However, for an odd number of zones, it will be apparent that connection to the inner and outer most electrodes at opposite faces of the transducer body would be made. With either construction, there is provided one less active zone than total electrodes. Also, electrode patterns involving different spacing between electrodes may be employed. For example, by increasing the spacing between adjacent outer electrodes, aperture shading is achieved for improved focal zone wavefield. Also, as noted above, use as a receiving transducer as well as a transmitting transducer is contemplated, as well as use of a plurality of such transducers in a transducer array. It is intended that the above and other such changes and modifications shall fall within the spirit and scope of the invention as defined in the appended claims.

I claim:

1. An ultrasonic phase reversal zone plate focusing transducer comprising, a transducer body of piezoelectric material uniformly polarized in a direction normal to opposite body surfaces, a plurality of radially spaced concentric electrodes on the opposite body surfaces with electrodes on one surface overlapping portions of adjacent electrodes on the opposite surface, and means for electrically connecting to inner and outer most electrodes for the provision of adjacent opposite phase active zones across the transducer body and transducer focusing.

2. The ultrasonic phase reversal zone plate focusing transducer as defined in claim 1 wherein, said transducer body is cylindrically shaped with parallel opposite body surfaces upon which said electrodes are disposed.

3. The ultrasonic phase reversal zone plate focusing transducer as defined in claim 1 wherein, said electrodes include a pair of central coaxially located circular different-diameter electrodes on opposite body surfaces and different-diameter annular electrodes surrounding said cnetral electrodes, and said means for electrically connecting to inner and outer most electrodes includes means for connecting to the smallest of the different diameter central electrodes.

4. The ultrasonic phase reversal zone plate focusing transducer as defined in claim 3 wherein electrode areas of overlap decrease in radial width with increased radial position of the electrodes such that the overlapping areas are of substantially equal area.

5. The ultrasonic phase reversal zone plate focusing transducer as defined in claim 1 for use as a transmitting transducer for concentrating ultrasonic energy produced thereby at a focal point spaced therefrom and including, an rf driving source connected to the inner and outer most electrodes through said connecting means.

6. A focusing ultrasonic phase reversal zone plate transducer comprising, a uniformly polarized cyclindrical shaped transducer body, a pair of central axially aligned electrodes of different diameter located at opposite faces of the transducer body, at least one annular electrode surrounding the small diameter circular electrode in overlapping position with a portion of the large diameter electrode at the opposite face, and means for series electrically connecting between said small diameter circular electrode and outer annular electrode to provide for at least a pair of adjacent phase reversed active zones adjacent said large diameter central electrode and focusing of the transducer.

7. The focusing ultrasonic phase reversal zone plate transducer as defined in claim 6 which includes a plurality of annular different-diameter electrodes at opposite faces of the transducer body with annular electrodes on one face in overlapping position with pairs of adjacent electrodes on the opposite face, the areas of overlap establishing adjacent opposite phase active zones within the transducer body.

8. The focusing ultrasonic phase reversal zone plate transducer as defined in claim 7 wherein the zones decrease in radial width with increased distance from the axis of the cylindrical shaped transducer body.

9. A focusing ultrasonic phase reversal zone plate transducer comprising, a uniformly poled piezoelectric transducer body, a plurality of annular electrodes on opposite faces of the transducer body with electrodes on one face in overlapping position relative to pairs of adjacent electrodes on the opposite face, and means for connecting between inner and outermost electrodes for the provision of a plurality of adjacent opposite phase active zones within the transducer body at the areas of electrode overlap for transducer focusing.

10. The focusing ultrasonic phase reversal zone plate transducer as defined in claim 9 wherein the number of active zones is one less than the total number of electrodes employed.

* * * * *